(12) United States Patent
Siegler et al.

(10) Patent No.: US 7,685,550 B2
(45) Date of Patent: Mar. 23, 2010

(54) METHOD FOR DESIGNING INTEGRATED CIRCUITS COMPRISING REPLACEMENT LOGIC GATES

(75) Inventors: Sascha Siegler, Unterhaching (DE); Roswitha Deppe, München (DE); Georg Georgakos, Fraunberg (DE)

(73) Assignee: Infineon Technologies AG, Munich (DE)

( * ) Notice: Subject to any disclaimer, the term of this patent is extended or adjusted under 35 U.S.C. 154(b) by 406 days.

(21) Appl. No.: 11/360,411

(22) Filed: Feb. 24, 2006

(65) Prior Publication Data
US 2006/0218517 A1 Sep. 28, 2006

Related U.S. Application Data

(63) Continuation of application No. PCT/DE2004/001825, filed on Aug. 16, 2004.

(30) Foreign Application Priority Data
Aug. 26, 2003 (DE) .................................. 103 39 283

(51) Int. Cl.
G06F 17/50 (2006.01)

(52) U.S. Cl. .................... 716/9; 716/4; 716/12; 716/18

(58) Field of Classification Search ................. 716/4, 716/9, 12, 18
See application file for complete search history.

(56) References Cited

U.S. PATENT DOCUMENTS

| 5,631,492 | A | 5/1997 | Ramus et al. |
| 6,255,845 | B1 | 7/2001 | Wong et al. |
| 6,321,371 | B1 | 11/2001 | Yount, Jr. |
| 6,618,847 | B1 * | 9/2003 | Hulse et al. .................... 716/8 |
| 6,888,755 | B2 * | 5/2005 | Harari ................... 365/185.02 |
| 2002/0108095 | A1 | 8/2002 | Barney et al. |
| 2003/0135835 | A1 | 7/2003 | Komaki |

FOREIGN PATENT DOCUMENTS

WO  WO 96/33495  10/1996

* cited by examiner

*Primary Examiner*—Thuan Do
(74) *Attorney, Agent, or Firm*—Patterson & Sheridan, L.L.P.

(57) ABSTRACT

In a method for designing integrated circuits comprising replacement logic components, a plurality of logic cells and a plurality of filler cells which fill interspaces between the logic cells are positioned on a chip area. In this case, some or all of the filler cells represent replacement logic components for the integrated circuit and have been or are interconnected or wired in such a way that they form capacitances in the integrated circuit.

19 Claims, 3 Drawing Sheets

METHOD FOR DESIGNING INTEGRATED CIRCUITS COMPRISING REPLACEMENT LOGIC GATES

CLAIM FOR PRIORITY

This application is a Continuation of prior PCT application No. PCT/DE2004/001825 which was published on Mar. 10, 2005 and which claims the benefit of priority to German Application No. 103 39 283.1 filed Aug. 26, 2003.

TECHNICAL FIELD OF THE INVENTION

The invention relates to a method, computer program product and system for designing integrated circuits having replacement logic components.

BACKGROUND OF THE INVENTION

Designing a new integrated circuit involves running through a well-defined sequence of design steps from the first chip specification through the microchip ready for use, said sequence being referred to as the "design flow".

In a first design step, the desired logic functionality is described with the aid of hardware description languages such as VHDL (Very High Speed Hardware Description Language). This design level is also referred to as RTL (Register Transfer Level).

The second design step involves synthesizing the netlist. It describes the set of logic cells forming the integrated circuit, and their interconnection.

The next design step, positioning and wiring (place and route), involves positioning the logic components assigned to the logic cells on the chip surface and defining the spatial positions of the leads. This is done using so-called filler cells that fill the space required for the leads between the logic cells.

The filler cells are also referred to as positioned filler cells since they occur only in the positioned netlist which represents the end product of this design step. The positioned netlist describes the circuit layout of the integrated circuit, usually in the GDSII format (General Data Structure). The masks for the individual steps of the production process can be derived from it. Said production process can be subdivided into the so-called FEOL (Front End of Line) section and the BEOL (Back End of Line) section, the first section describing the production of the semiconductor components and the second section describing the application of the wirings or the metallization layers.

In the production process, costs and time can be saved if properties that are generally defined at the beginning of the "Design Flow" can still be corrected at a late point in time and, consequently, the iteration cycles required for the corrections remain small.

The space kept free for the leads by means of the filler cells in the place and route design step can be utilized for a different purpose. One possible procedure consists in constructing the space beneath the leads in the region of the filler cells as capacitances. Such filler cells realized as capacitances are utilized for stabilizing voltages.

The Patent Specification U.S. Pat. No. 6,321,371 B1 discloses a method for producing redesignable integrated circuits. In this case, it is possible to correct logic malfunctions of the integrated circuit, caused by an error in the design e.g. through incomplete verification, with the aid of an altered wiring.

The redesignability is achieved by filling the region of the filler cells with additional semiconductor components in the place and route design step. The latter represent replacement logic components ("spare logic gates") which are used as required—in the course of a redesign—to correct malfunctions of the logic components assigned to the logic cells. The required iteration cycle for logic correction is therefore restricted to the BEOL section of the production process.

Since the paths between the error-exhibiting logic components and the replacement logic components that effect corrective intervention are intended to be short, a maximum number of filler cells are constructed as replacement logic components. As a result, under certain circumstances, the capacitances that were present in the filler cells and were utilized for stabilizing voltages are omitted to the greatest possible extent.

The document U.S. Pat. No. 6,321,371 B1 discloses providing filler cells which represent replacement logic components of the integrated circuit. The replacement logic components are used as required in the context of a redesign of the metallization layers of the integrated circuit for the replacement of defective logic components.

The document WO 96/33495 A1 reveals the further-reaching teaching whereby such replacement logic components which are not required for the replacement of defective logic components are subsequently interconnected as backup capacitances in the redesign step. By virtue of this measure, the subsequently "superfluous" replacement logic components can also still be used expediently, namely as backup capacitances.

SUMMARY OF THE INVENTION

The invention relates to a method for designing redesignable integrated circuits in which filler cells represent replacement logic components. Furthermore, the invention relates to a computer program product for executing the design method, a machine-readable cell library, a data carrier for storing the computer program product or the cell library, a computer system for executing the design method, and an integrated circuit.

In one embodiment of the invention, includes a fraction of the replacement logic components available required for the correction of malfunctions of the logic components assigned to the logic cells. The great majority remain in an inactive state. That is, a substantial portion of the chip surface remains unused, if it is not interconnected anew in a further time-consuming redesign step.

In another embodiment of the present invention, the capacitive properties are utilized, in a targeted manner, of the inactive and hence unused replacement logic components. Through a suitable interconnection or wiring of the differently doped regions of the semiconductor components in the filler cells which represent replacement logic components, it is possible to utilize the capacitive properties thereof. There are two possibilities for this, depending on how the filler cells representing the replacement logic components are defined in the cell library. If the filler cells have already been interconnected as capacitances (that is to say comprise both information with regard to the semiconductor structure of a logic component and the information with regard to the capacitive interconnection thereof), only the step of positioning these interconnected filler cells is to be performed. If the cell library includes "uninterconnected" filler cells (which includes information with regard to the semiconductor structure and, if appropriate, also information with regard to a basic metallization, but not information regarding capacitive interconnection according to the invention), it is necessary to carry out the capacitive wiring according to the invention of the different doped regions of the semiconductor structure in a further method step. This method step may be effected in an automated manner or by means of user interaction and, in particular, be part of a so-called (metal) redesign in which the wiring of the differently doped regions within a cell is redesigned. It is pointed out that the second possibility, which has a further method step, in which filler cells which represent replacement logic components for the integrated circuit are subsequently interconnected as capacitance, is not part of the invention.

The capacitances which are thus available can be utilized in diverse ways.

One advantageous embodiment of the invention includes using such filler cells which represent replacement logic components and have been interconnected as capacitance for the stabilization of voltages, that is to say permitting them to act as backup capacitances.

Backup capacitances are generally situated in direct proximity to the loads. The inductances of the leads are thereby minimized and high-frequency interference can be effectively filtered.

In the present invention, loads and backup capacitances are situated on a chip surface. As a result, it is possible also to minimize correspondingly high-frequency interference such as switching noise.

A filler cell which represents a replacement logic component and has been interconnected (originally or subsequently) as backup capacitance is connected to two different potentials and serves for stabilizing the corresponding potential difference. In the simplest case, one of the terminals of a given filler cell which represents a replacement logic component is connected to the supply voltage VDD, and another terminal is connected to ground VSS. By virtue of a low-noise supply voltage, a significant contribution to the noise of decision unit thresholds is minimized, inter alia. As a result, the error rate decreases and the maximum clock rate of the integrated circuit can be corresponding increased.

In one preferred embodiment of the method according to the invention, the filler cells that represent replacement logic components are interconnected as standard as backup capacitance, whereby a maximum total capacitance is provided for the stabilization of the respective voltages.

If errors in the logic functionality occur after the first design of the integrated circuit, then the erroneous logic can be corrected by means of the replacement logic components. In a redesign, for this purpose the wirings of individual filler cells which represent replacement logic components and have been interconnected in such a way that they form backup capacitances in the integrated circuit are adapted in such a way that they are changed in terms of their function to form the logic component. Since, in general, only a fraction of the filler cells which represents replacement logic components are affected by such a redesign, the total capacitance which is available as backup capacitance remains virtually unchanged.

In a further preferred embodiment, the filler cells are equipped with semiconductor components and thus represent replacement logic components for the integrated circuit. Consequently, minimum paths between a logic component with errors and the closest replacement logic component are guaranteed in the case of a redesign. The standard interconnection as backup capacitance ensures, however, that the filler cells provide the maximum total capacitance for the stabilization of the supply voltages.

The method according to the invention makes it possible to design redesignable integrated circuits with effectively stabilized supply voltages.

Besides the use as backup capacitances, it is also conceivable for filler cells that represent replacement logic components and have been interconnected as capacitance to be utilized in a targeted manner as capacitive elements for other functions, for example in filter arrangements.

In another embodiment of the invention, there is a computer program product which puts the developer in a position to execute the above-described method steps mechanically and in an automated manner. In this case, during the positioning of the cells on the chip surface, recourse is had as standard to filler cells which represent replacement logic components and have already been wired or interconnected as capacitance. Is is likewise conceivable for filler cells which represent replacement logic components that by definition have no wiring or interconnection to be provided with a wiring or interconnection as capacitance within a redesign step. This can be done as standard, that is to say in an automated manner or via an intervention by the user. A user intervention by the developer may also be provided in the case of a redesign in which a replacement logic component that has been interconnected as capacitance is intended to be changed in terms of its function to form the logic component. Furthermore, the interconnection of such replacement logic components which have had their function changed to form the capacitance to form backup capacitances can be performed automatically by means of the computer program product. In this case, computer program product is understood to mean the computer program as a commercial product, in whatever structural (machine-readable, interpretable, in the form of input or control parameters, etc.) and physical (on a computer-readable data carrier, distributed via a network etc.) form that may be.

A machine-readable cell library defines one or a plurality of cells for positioning onto a chip surface during the design of an integrated circuit, which can be accessed, for example by means of a computer program product during a design method for integrated circuits. In this case, the machine-readable cell library according to the invention contains at least one cell representing a logic component for an integrated circuit that has been interconnected or wired as capacitance.

On account of the presence of replacement logic components and also the capacitive interconnection thereof, the integrated circuit that is not encompassed by the invention has both the desired redesignability and improved electrical properties.

BRIEF DESCRIPTION OF THE DRAWINGS

The invention is described in more detail below with reference to exemplary embodiments and the drawings, in which.

DETAILED DESCRIPTION OF THE INVENTION

Figure 1:
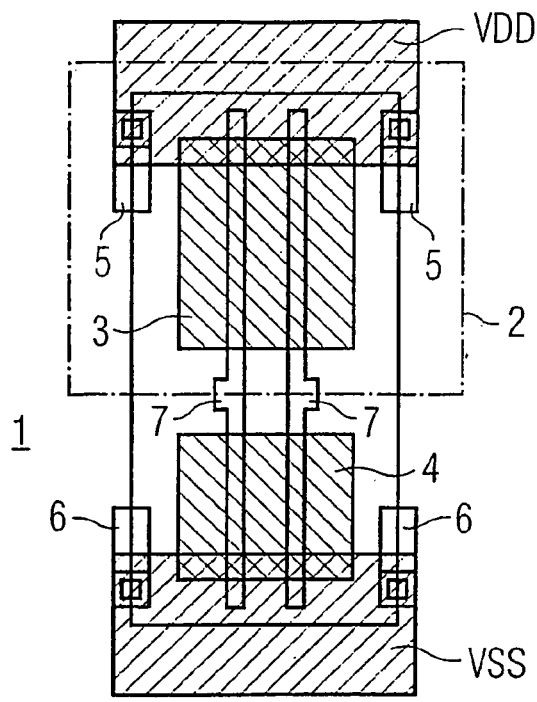
FIG. 1 shows the semiconductor structure of a non-wired replacement logic component without a function.

FIG. 1 shows the basic structure, that is the semiconductor structure without interconnection, with a replacement logic component comprising 4 transistors. The upper region of figure illustrates an n-type well 2 on a p-doped substrate 1, within which well is situated a p-type diffusion region 3 with overlying gate electrodes (polysilicon gates) 7. This arrangement forms two p-channel MOSFETs, both transistors sharing the central region of the p-type diffusion region as a common electrode. The lower region of the figure illustrates an n-type diffusion region 4 with overlying gate electrodes 7 in the p-doped substrate 1. This arrangement forms two n-channel MOSFETs. The upper and lower edges of the figure respectively illustrate sections of the metallic interconnects of the supply voltage VDD and ground VSS, which are connected as standard to the n-type well 2 (via terminal 5) and the substrate 1 (via terminal 6), respectively.

The polysilicon gates 7 serve as common gate electrode for in each case a p-channel and an n-channel MOSFET. Different logic components, that is to say logic gates (NAND, NOR, etc.) can be constructed through corresponding interconnection of the transistor electrodes.

Various possibilities for utilizing capacitive properties of the differently doped regions are illustrated in the following figures.

Figure 2:
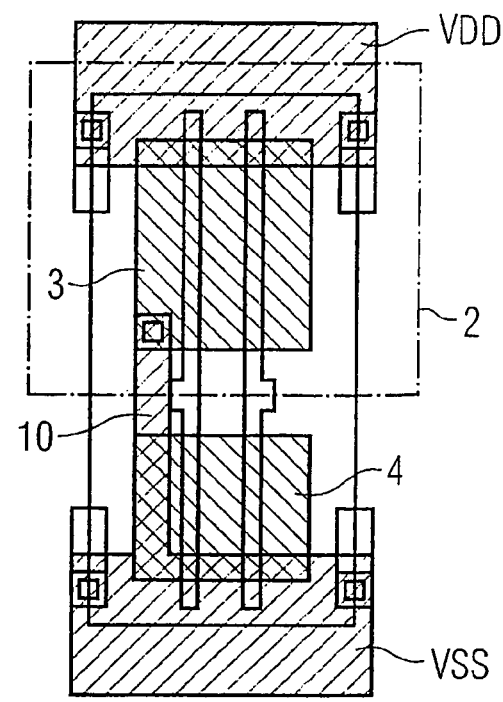
FIG. 2 shows a capacitance formed by the connection of the n-type well to the supply voltage and of the p-type diffusion region to ground.

In FIG. 2, the capacitance essentially comprises a capacitor, the first electrode of which is formed by the n-type well 2. It is connected as standard to the supply voltage VDD. The second electrode is formed by the p-type diffusion region 3, which is connected to ground VSS by terminal 10.

Figure 3:
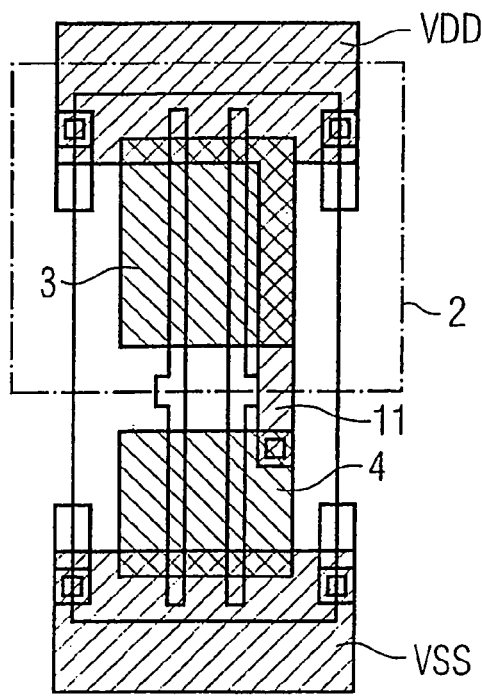
FIG. 3 shows a capacitance formed by the connection of the n-type diffusion region to the supply voltage and of the substrate to ground.

In FIG. 3, the capacitance likewise essentially comprises a capacitor, the first electrode of which is formed by the n-type diffusion region 4 and is connected to the supply voltage VDD via terminal 11. The second electrode is formed by the p-type substrate 1, which is connected as standard to ground VSS.

Figure 4:
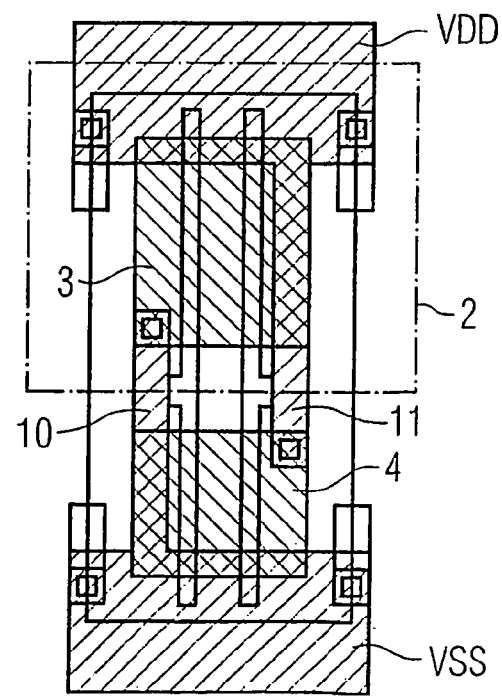
FIG. 4 shows a capacitance formed by the connection of the n-type diffusion region and of the n-type well to the supply voltage and of the substrate and of the p-type diffusion region to ground.

FIG. 4 combines the two previous exemplary embodiments. The capacitance essentially comprises two capacitors.

Figure 5:
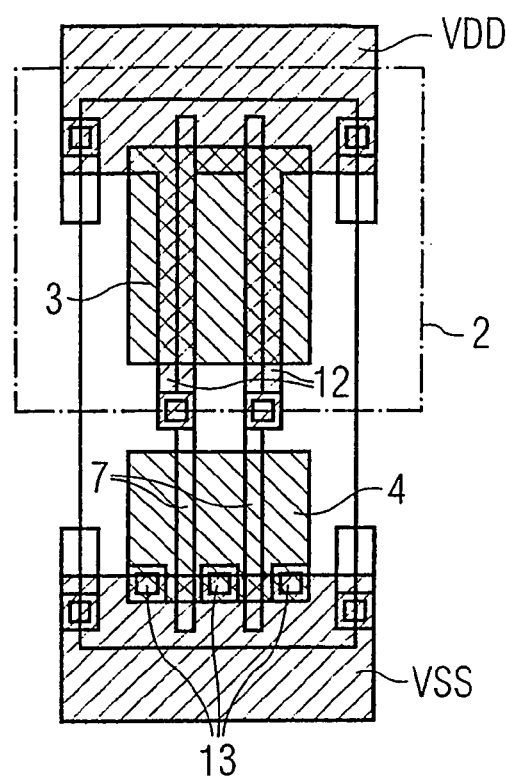
FIG. 5 shows a capacitance formed by the connection of the polysilicon gates to the supply voltage and of the n-type diffusion region to ground.

In FIG. 5, the capacitance comprises a plurality of capacitor electrodes. The polysilicon gates 7 are connected to the supply voltage VDD (via terminal 12). The n-type diffusion region 4 is connected to ground VSS (via terminals 13).

Figure 6:
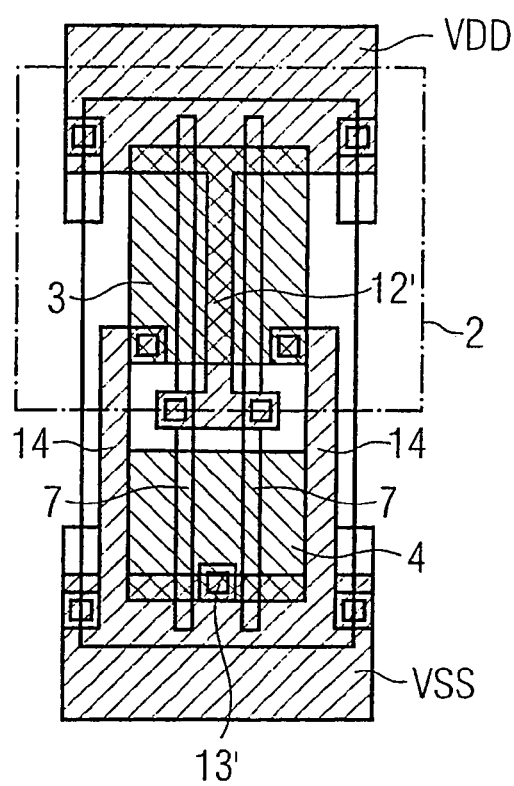
FIG. 6 shows a capacitance formed by the connection of the polysilicon gates to the supply voltage and of the p-type and n-type diffusion regions to ground.

FIG. 6 extends the exemplary embodiment from FIG. 5. Here the p-type diffusion region 3 is additionally utilized as ground electrode (via terminals 14). The polysilicon gates 7 are connected to the supply voltage VDD (via terminal 12'). The central region of the n-type diffusion region 4 is connected to ground VSS (via terminal 13').

However, a multiplicity of further wiring possibilities are also conceivable which make it possible to utilize capacitive properties of the differently doped regions of semiconductor components in replacement logic components.

The above exemplary embodiments show a simply constructed replacement logic component having a total of four transistors. However, the invention also extends to replacement logic components of any desired complexity. In particular, more complex replacement logic components comprise larger doping regions, whereby larger capacitances can be realized.

In the case of complex replacement logic components containing a multiplicity of semiconductor components, it is conceivable, moreover, to utilize only one portion of the replacement logic component for the logic correction of the integrated circuit, and to utilize another portion as capacitance, by contrast.

Different logic functions of the replacement logic components can be selected in the course of a redesign.

By way of example, a NAND gate or a NOR gate can be realized by way of the replacement logic component having in each case two n-channel and p-channel MOSFETs as shown in the exemplary embodiments. If the replacement logic component is interconnected as an inverter, by contrast, a portion of the semiconductor components of the replacement logic component are required for this purpose. The remaining regions can continue to be utilized as capacitance.

Furthermore, it is conceivable to utilize the capacitive properties of further unused semiconductor components on the chip surface. In the course of a redesign, it would be possible for this purpose to correspondingly wire the differently doped regions of the semiconductor components with errors within the affected logic components assigned to logic cells. The proportion of the unused chip surface can be minimized in this way.

Figure 9:
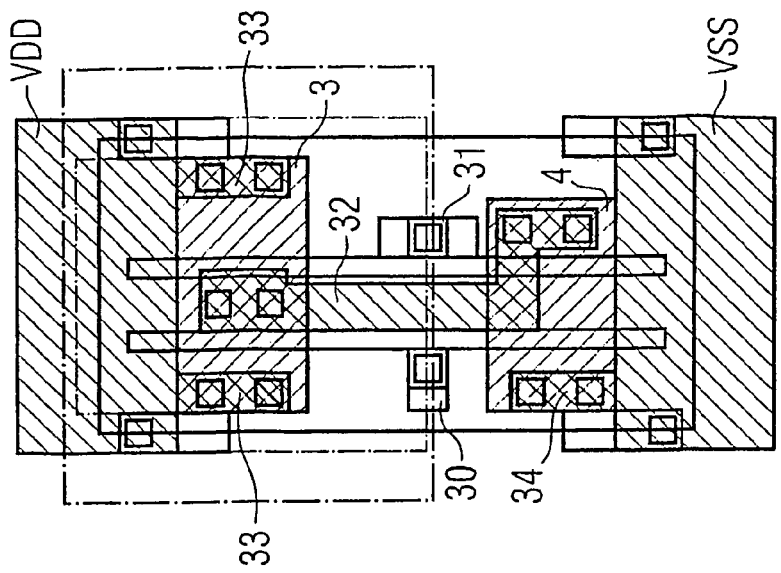
FIG. 9 shows a logic component with interconnection as a NAND gate.
Figure 8:
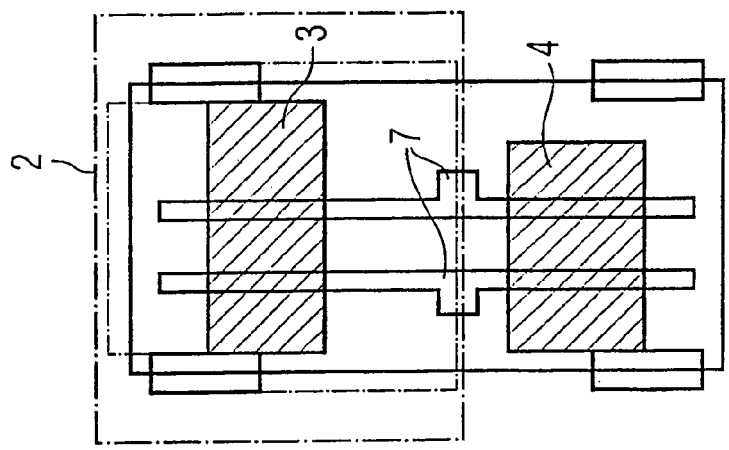
FIG. 8 shows a logic component without interconnection.
Figure 7:
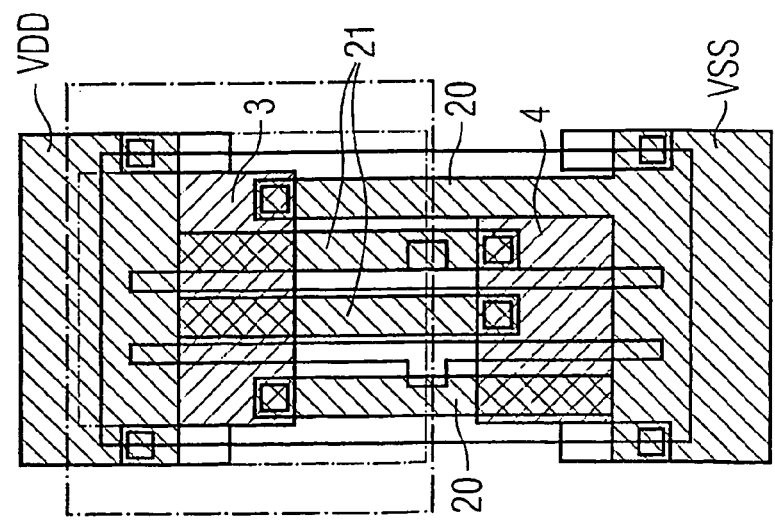
FIG. 7 shows a logic component with interconnection as backup capacitance.

FIGS. 7-9 show the sequence of a redesign. In FIG. 7, the logic component has been interconnected as backup capacitance. The construction of the capacitance corresponds to that of the capacitance from FIG. 4. The p-type diffusion region 3 is connected to ground VSS via the leads 20. The n-type diffusion region 4 is connected to the supply voltage VDD via the leads 21. A first step of the redesign involves removing the metallization layers (VDD, 20, 21, VSS) in the positioned netlist. There is no change made to the FEOL or semiconductor structure of the logic component, such as n-type well 2, p-type or n-type diffusion region 3 or 4, polysilicon gates 7 (FIG. 8). In a second step of the redesign, new metallization layers (VDD, 30-34, VSS) are inserted into the positioned netlist and the logic component is thus rewired. In FIG. 9, the four MOSFETs are interconnected as NAND gates. In this case, leads 30 and 31 form the two logic inputs of the NAND gate, lead 32 is the logic output. Leads 33 connect the two p-channel MOSFETs connected in parallel to the supply voltage VDD, and lead 34 connects the n-channel MOSFETs connected in series to ground VSS.

The "design flow" or the sequence of the design process is controlled with the aid of one or more computer programs. For this purpose, the computer program is loaded into the internal memory of a computer. The user interaction takes place via the customary interfaces for inputting (keyboard, mouse, data streams with input data, etc.) and outputting (monitor, loudspeaker, data stream with output data, etc.). The results of the individual design steps are generated and output with the aid of the computer program product.

What is claimed is:

1. A method for designing an integrated circuit comprising replacement logic components, comprising:

configuring a computer with a program to perform an operation comprising:
providing a plurality of filler cells comprising a semiconductor structure configured to form logic components for the integrated circuit, wherein the plurality of filler cells are internally interconnected to form capacitances; and thereafter positioning a plurality of logic cells and the plurality of filler cells, which fill interspaces between logic cells, on a chip area.

2. The method as claimed in claim 1, wherein the capacitances formed by the plurality of filler cells are used as backup capacitances in the integrated circuit.

3. The method as claimed in claim 1, wherein only the plurality of filler cells comprising the semiconductor structure configured to form logic components for the integrated circuit are positioned and are interconnected as capacitances.

4. The method as claimed in claim 1, wherein only the plurality of filler cells that are comprising the semiconductor structure configured to form logic components for the integrated circuit are positioned.

5. The method as claimed in claim 1, wherein the operation further comprises:
performing a redesign of the circuit design, in which a function of at least one of the plurality of filler cells is changed by a new interconnection to form a logic component of the integrated circuit.

6. The method as claimed in claim 5, wherein different logic functions of the logic component represented by the at least one of the plurality of filler cells can be selected by means of a new interconnection of the at least one of the plurality of filler cells.

7. The method as claimed in claim 1, wherein the semiconductor structure comprises at least one of a n-type well, a n-type diffusion region, and a p-type diffusion region.

8. The method as claimed in claim 1, wherein the logic components are at least one of a NAND-gate, a NOR-gate, and an inverter.

9. A computer product which is stored on a medium and comprises computer-readable program means which enable a computer to execute a method, the method comprising:
providing a plurality of filler cells comprising a semiconductor structure configured to form logic components for the integrated circuit, wherein the plurality of filler cells are internally interconnected to form capacitances; and thereafter
positioning a plurality of logic cells and the plurality of filler cells, which fill interspaces between logic cells, on a chip area.

10. A computer system, comprising means for executing:
providing a plurality of filler cells comprising a semiconductor structure configured to form logic components for the integrated circuit, wherein the plurality of filler cells are internally interconnected to form capacitances; and thereafter
positioning a plurality of logic cells and the plurality of filler cells, which fill interspaces between logic cells, on a chip area.

11. A method for designing an integrated circuit comprising replacement logic components, comprising:
configuring a computer with a program to perform an operation comprising:
positioning a plurality of logic cells and a plurality of filler cells on a chip area, the filler cells comprising a semiconductor structure configured to form logic components for the integrated circuit and fill interspaces between logic cells; and
after positioning the plurality of logic cells and the plurality of filler cells, forming capacitances for the integrated circuit by internally interconnecting at least some of the filler cells.

12. The method of claim 11, wherein the capacitances formed by filler cells are used as backup capacitances in the integrated circuit.

13. The method as claimed in claim 11, wherein all positioned filler cells are interconnected as capacitances.

14. The method as claimed in claim 11, wherein the operation further comprises:
performing a redesign of the circuit design, in which a function of at least one of the plurality of filler cells is changed by a new interconnection to form the logic component of the integrated circuit.

15. The method as claimed in claim 14, wherein different logic functions represented by the at least one of the plurality of filler cells can be selected by means of a new interconnection the at least one of the plurality of filler cells.

16. The method as claimed in claim 11, wherein the semiconductor structure comprises at least one of a n-type well, a n-type diffusion region, and a p-type diffusion region.

17. The method as claimed in claim 11, wherein the logic components are at least one of a NAND-gate, a NOR-gate, and an inverter.

18. A computer product loaded which is stored on a medium and comprises computer-readable program means which enable a computer to execute a method, the method comprising:
positioning a plurality of logic cells and a plurality of filler cells on a chip area, the plurality of filler cells comprising a semiconductor structure configured to form logic components for the integrated circuit and fill interspaces between logic cells; and
after positioning the plurality of logic cells and the plurality of filler cells on the chip area, forming capacitances for the integrated circuit by internally interconnecting at least some of the plurality of filler cells.

19. A computer system, comprising means for executing:
positioning a plurality of logic cells and a plurality of filler cells on a chip area, the plurality of filler cells comprising a semiconductor structure configured to form logic components for the integrated circuit and fill interspaces between logic cells; and
after positioning the plurality of logic cells and the plurality of filler cells on the chip area, forming capacitances for the integrated circuit by internally interconnecting at least some of the plurality of filler cells.

* * * * *